US006811814B2

(12) United States Patent
Chen et al.

(10) Patent No.: US 6,811,814 B2
(45) Date of Patent: *Nov. 2, 2004

(54) METHOD FOR GROWING THIN FILMS BY CATALYTIC ENHANCEMENT

(75) Inventors: Ling Chen, Sunnyvale, CA (US); Wei Cao, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 105 days.

This patent is subject to a terminal disclaimer.

(21) Appl. No.: 10/052,049

(22) Filed: Jan. 16, 2002

(65) Prior Publication Data

US 2002/0122884 A1 Sep. 5, 2002

Related U.S. Application Data

(60) Provisional application No. 60/261,946, filed on Jan. 16, 2001.

(51) Int. Cl.$^7$ .............................................. C23C 16/18
(52) U.S. Cl. ............... 427/248.1; 427/252; 427/255.28; 427/255.7
(58) Field of Search .............................. 427/248.1, 252, 427/255.28, 255.7; 117/88, 104

(56) References Cited

U.S. PATENT DOCUMENTS

| 4,058,430 A | 11/1977 | Suntola et al. |
| 4,389,973 A | 6/1983 | Suntola et al. |
| 4,413,022 A | 11/1983 | Suntola et al. |

(List continued on next page.)

FOREIGN PATENT DOCUMENTS

| EP | 0442490 | | 8/1991 |
| EP | 499294 | A | 8/1992 |
| EP | 0799641 | | 10/1997 |
| GB | 2355727 | | 5/2001 |
| JP | 62091495 | A | 4/1987 |
| JP | 4031396 | A | 2/1992 |
| JP | 11269652 | A | 10/1999 |
| JP | 2001062244 | A | 3/2001 |
| WO | 199901595 | | 1/1991 |
| WO | 199110510 | | 7/1991 |
| WO | 199929924 | | 6/1999 |
| WO | 200015865 | | 3/2000 |
| WO | 200015881 | | 3/2000 |
| WO | 200016377 | | 3/2000 |
| WO | 200055895 | | 4/2000 |
| WO | 200063957 | | 10/2000 |
| WO | 200079019 | A | 12/2000 |
| WO | 200079576 | | 12/2000 |
| WO | 200115220 | A | 3/2001 |
| WO | 200127346 | A | 4/2001 |
| WO | 200127347 | A | 4/2001 |
| WO | 200129280 | A | 4/2001 |
| WO | 200136702 | | 5/2001 |
| WO | 200140541 | | 6/2001 |

OTHER PUBLICATIONS

J.W. Elam, C.E. Nelson, R.K. Grubs, S.M. George Nucleation and growth during tungsten atomic layer deposition of $SiO_2$ surfaces, Thin Solid Films 386 41–52 (2001).

J.W. Klaus, S.J. Ferro, S.M. George Atomic layer deposition of tungsten using sequential surface chemisty with a sacrifical stripping reaction, Thin Solid Films 360 145–153 (2000).

S.P. Denbaars, A. Hariz, C. Beyler, B.Y. Maa, Q. Chen, and P.D. Dapkus The Growth of AlGaAs/GaAs heterostructures by atomic layer epitaxy, Mat. Res. Soc. Symp. Proc. vol. 102, 527–532, 1988.

T. Suntola and M. Simpson Atomic Layer Epitaxy, Blackie and Son, 1990.

T.I. Hukka, R.E. Rawles, M.P. D'Evelyn Novel method for chemical vapor deposition and atomic layer epitaxy using radical chemistry, Thin Solid Films 225 (Mar. 25, 1993) 212–218.

N. Kobayashi, T. Makimoto, Y. Yamauchi, and Y. Horikoshi Investigation of growth processes in flow–rate modulation epitaxy and atomic layer epitaxy by new in–situ optical monitoring method, Acta Polytechnica Scandinavica, Chemical Technology and Metallurgy Series, No. 195 (Jun. 1, 1990), pp. 139–144.

D.T.J. Hurle Handbook of Crystal Growth 3: Thin Films and Epitaxy Part B: Growth Mechanisms and Dynamics, Chapter 14 (Atomic Layer Epitaxy), Elsevier Science B.V., 1994.

C.H. Liu, M. Yokoyama, and Y.K. Su Effect of Atomic Layer Epitaxy Growth Conditions on the Properties of ZnS Epilayers on (100)–Si Substrate, Jpn.J.Appl.Phys. vol. 35 pp. 5416–5420, (1996).

J.W. Klaus, A.W. Ott, J.M. Johnson, and S.M. George Atomic Layer controlled growth of $SiO_2$ films using binary reaction sequence chemistry, Appl. Phys. Lett. 70 (9), Mar. 3, 1997.

S. Yamaga and A. Yoshikawa Atomic layer epitaxy of ZnS by a new gas supplying system in low–pressure metalorganic vapor phase epitaxy, Journal of Crystal Growth 117 152–155 (1996).

S. Nishikawa, H. Kakinuma, T. Watanabe, and K. Nihei Preparation of a–Si:H/a–$Si_{1-x}Cx$:H Superlattices, Jpn.J.Appl.Phys. vol. 25, No. 8 pp. 1141–1143 )Aug. 1, 1986).

A. Watanabe, T. Isu, M. Hata, T. Kamijoh, and Yoshifumi The mechanism of self–limiting growth of atomic layer epitaxy of GaAs by metalorganic molecular beam epitaxy using trimethylgallium and arsine, Jpn.J.Appl.Phys. vol. 28 No. 7 pp. L 1080 –L 1082 (Jul. 1, 1989).

(List continued on next page.)

*Primary Examiner*—Timothy Meeks
(74) *Attorney, Agent, or Firm*—Moser, Patterson & Sheridan LLP

(57) ABSTRACT

A method of growing a thin film onto a substrate. A precursor of the film is fed into a reaction space in the form of a vapor phase pulse causing the precursor to adsorb onto the surface of the substrate to form a layer thereof. A catalyst is susequently fed into the reaction space in an amount to substantially convert the layer of the precursor to the desired thin film. The above steps may be repeated to achieve the desired film thickness.

19 Claims, No Drawings

U.S. PATENT DOCUMENTS

| | | | |
|---|---|---|---|
| 4,767,494 | A | 8/1988 | Kobayashi et al. |
| 4,806,321 | A | 2/1989 | Nishizawa et al. |
| 4,840,921 | A | 6/1989 | Matsumoto |
| 4,845,049 | A | 7/1989 | Sunakawa |
| 4,859,627 | A | 8/1989 | Sunakawa |
| 4,861,417 | A | 8/1989 | Mochizuki et al. |
| 4,876,218 | A | 10/1989 | Pessa et al. |
| 4,993,357 | A | 2/1991 | Scholz |
| 5,082,798 | A | 1/1992 | Arimoto |
| 5,130,269 | A | 7/1992 | Kitahara et al. |
| 5,166,092 | A | 11/1992 | Mochizuki et al. |
| 5,225,366 | A | 7/1993 | Yoder |
| 5,250,148 | A | 10/1993 | Nishizawa et al. |
| 5,256,244 | A | 10/1993 | Ackerman |
| 5,270,247 | A | 12/1993 | Sakuma et al. |
| 5,278,435 | A | 1/1994 | Van Hove et al. |
| 5,281,274 | A | 1/1994 | Yoder |
| 5,290,748 | A | 3/1994 | Knuuttila et al. |
| 5,294,286 | A | 3/1994 | Nishizawa et al. |
| 5,300,186 | A | 4/1994 | Kitahara et al. |
| 5,316,793 | A | 5/1994 | Wallace et al. |
| 5,330,610 | A | 7/1994 | Eres et al. |
| 5,336,324 | A | 8/1994 | Stall et al. |
| 5,338,389 | A | 8/1994 | Nishizawa et al. |
| 5,374,570 | A | 12/1994 | Nasu et al. |
| 5,395,791 | A | 3/1995 | Cheng et al. |
| 5,438,952 | A | 8/1995 | Otsuka |
| 5,443,033 | A | 8/1995 | Nishizawa et al. |
| 5,458,084 | A | 10/1995 | Thorne et al. |
| 5,480,818 | A | 1/1996 | Matsumoto et al. |
| 5,483,919 | A | 1/1996 | Yokoyama et al. |
| 5,484,664 | A | 1/1996 | Kitahara et al. |
| 5,532,511 | A | 7/1996 | Nishizawa et al. |
| 5,637,530 | A | 6/1997 | Gaines et al. |
| 5,705,224 | A | 1/1998 | Murota et al. |
| 5,711,811 | A | 1/1998 | Suntola et al. |
| 5,730,802 | A | 3/1998 | Ishizumi et al. |
| 5,744,192 | A | 4/1998 | Nguyen et al. |
| 5,851,849 | A | 12/1998 | Comizzoli et al. |
| 5,855,680 | A | 1/1999 | Soininen et al. |
| 5,879,459 | A | 3/1999 | Gadgil et al. |
| 5,916,365 | A | 6/1999 | Sherman |
| 5,963,139 | A | 10/1999 | Littke |
| 6,015,590 | A | 1/2000 | Suntola et al. |
| 6,025,627 | A | 2/2000 | Forbes et al. |
| 6,036,773 | A | 3/2000 | Wang et al. |
| 6,042,652 | A | 3/2000 | Hyun et al. |
| 6,043,177 | A | 3/2000 | Falconer et al. |
| 6,090,442 | A | * 7/2000 | Klaus et al. |
| 6,110,530 | A | 8/2000 | Chen et al. |
| 6,113,977 | A | 9/2000 | Soininen et al. |
| 6,124,158 | A | 9/2000 | Dautartas et al. |
| 6,130,147 | A | 10/2000 | Major et al. |
| 6,139,700 | A | 10/2000 | Kang et al. |
| 6,143,659 | A | 11/2000 | Leem |
| 6,174,377 | B1 | 1/2001 | Doering et al. |
| 6,174,809 | B1 | 1/2001 | Kang et al. |
| 6,197,683 | B1 | 3/2001 | Kang et al. |
| 6,200,893 | B1 | 3/2001 | Sneh |
| 6,203,613 | B1 | 3/2001 | Gates et al. |
| 6,207,302 | B1 | 3/2001 | Sugiura et al. |
| 6,248,605 | B1 | 6/2001 | Harkonen et al. |
| 6,270,572 | B1 | 8/2001 | Kim et al. |
| 6,287,965 | B1 | 9/2001 | Kang et al. |
| 6,291,876 | B1 | 9/2001 | Stumborg et al. |
| 6,305,314 | B1 | 10/2001 | Sneh et al. |
| 6,306,216 | B1 | 10/2001 | Kim et al. |
| 6,316,098 | B1 | 11/2001 | Yitzchaik et al. |
| 6,464,779 | B1 | * 10/2002 | Powell et al. |
| 6,503,330 | B1 | * 1/2003 | Sneh et al. |
| 2002/0018849 | A1 | * 2/2002 | George et al. |

OTHER PUBLICATIONS

J. Nishizawa, H. Abe and T. Kurabayashi Molecular layer epitaxy, J. Electrochem. Soc.: Solid State Science and Technology vol. 132, No. 5 1197–1200 (May 1, 1985).

K. Kodama, M. Ozeki, K. Mochizuki, and N. Ohtsuka In situ x–ray photoelectron spectroscopic study of GaAs grown by atomic layer epitaxy, Appl. Phys. Lett. 54(7) 656–657 (Feb. 13, 1989).

J. Creighton, K. Lykke, V. Shamamian, and B. Kay Decomposition of trimethylgallium on the gallium–rich GaAs (100) surface: implications for atomic layer epitaxy, Appl. Phys. Lett. 57 (3) 279–281 (Jul. 16, 1990).

J.T. Yates, C.C. Cheng, Q. Gao, M.L. Colaianni, and W.J. Choyke Atomic H: a reagent for the extraction of chemical speies from Si surfaces, Thin Solid Films 225 150–154 (1993).

T. Suntola Cost–effective processing by atomic layer epitaxy, Thin Solid Films 225 96–98 (1993).

S. Imai, T. Iizuka, O. Sugiura, and M. Matsumura Atomic layer epitaxy of Si using atomic H, Thin Solid Films 225 168–172 (1993).

H. Nagasawa and Y. Yamaguch Atomic level epitaxy of 3C–SiC by low pressure vapour deposition with alternating gas supplyi, Thin Solid Films 225 230–234, 1994.

T. Suntola Development challenges of atomic layer epitaxy, Acta Polytechnica Scandinavica, Chemical Technology and Metallurgy Series, No. 195 (1990), pp. 93–106, Jun. 1, 1990.

J. Wisser, P. Czuprin, W. Richter, and P. Balk Pulsed flow epitaxy of InP in a standard LP–MOVPE reactor, Acta Polytechnica Scandinavica, Chemical Technology and Metallurgy Series, No. 195 (Jun. 1,1990), pp. 123–129.

H. Yokoyama, M. Shinohara, and N. Inoue Atomic layer epitaxy of GaAs using nitrogen carrie gas, Appl. Phys. Lett. 59(17) 2148–2149, Oct. 21, 1991.

M. de Keijser and C. van Opdorp Atomic layer epitaxy of gallium arsenide with the use of atomic hydrogen, Appl. Phys. Lett. 58(11), 1187–1189, Mar. 18, 1991.

E. Colas, R. Bhat and B.J. Skromme; G.C. NihousAtomic layer of epitaxy of device quality GaAs, Appl. Phys. Lett. 55(26), 2769–2771, Dec. 25, 1989.

P.C. Colter, S.A. Hussien, A. Dip, M.U. Erdogan, W.M. Duncan and S.M. Bedair Atomic layer epitaxy of device GaAs with a 0.6 um/h growth rate, Appl. Phys. Lett. 59(12), 1440–1442, Sep. 16, 1991.

S.M. Bedair, M.A. Tischler, T. Katsuyama, and N.A. El–Masry Atomic layer epitaxy of III–V binary compounds, Appl. Phys. Lett, 47(1), Jul. 1, 1985.

M. Ozeki, K. Mochizuki, N. Ohtstuka, and K. Kodama Kinetic processes in atomic–layer epitaxy of GaAs and AIAs using a pulsed vapor–phase method, J. Vac. Sci. Technol. B, vol. 5, No. 4, Jul. 1, 1987/Aug. 1987.

Colin H.L. Goodman Atomic Layer epitaxy, J. Appl. Phys. 60 (3), Aug. 1, 1986.

S.M. Rossnagel, A. Sherman and F. Turner Plasma–enhanced atomic layer deposition of Ta and Ti for interconnect diffusion barriers.

R. Ares, C.A. Tran an S.P. Watkins Determination of growth parameters for atomic layer epitaxy using reflectance difference spectroscopy, Can. J. Phys. (Suppl.) 74:S85–S88 (1996).

I. Bhat, S. Akram Atomic layer epitaxial growth studies of ZnSe using dimethylzinc and hydrogen selenide, Journal of Crystal Growth 138 127–130 (1994).

S.P. Watkins, T. Pinnington, J. Hu, P. Yeo, M. Kluth, N.J. Mason, R.J. Nicholas, P.J. Walker Infrared single wavelength gas composition monitoring for metalorganic vapour–phase epitaxy, Journal of Crystal Growth 221 166–171 (2000).

D. Rajavel, A. Conte, C.J. Summers Pyrolsis characteristics of iodine precursors for gas source n–type doping of II–VI compounds, Journal of Crystal Growth 140 327–335 (1994).

M. Leskela, M. Ritala ALD precursor chemistry: Evolution and future challenges, J. Phys. IV France 9 Pr8–837–Pr8–852 (Jun. 21, 1999).

C.H. Liu, M. Yokohama, Y.K. Su, and N. C. Lee Atomic Layer Epitaxy of ZnS by low–pressure horizontal metalorganic chemical vapor deposition, Jpn. J. Appl. Phys. vol. 35 pp. 2749–2753, Part 1, No. 5A, (May 1, 1996).

A. Watanabe, T. Isu, M. Hata, T. Kamijoh, and Y. Katayama The Mechanism of self–limiting growth of atomic layer epitaxy of GaAs by metalorganic molecular beam epitaxy using trimethylgallium and arsine, Japanese Journal of Applied Physics, vol. 28, No. 7, Jul. 1989, pp. L. 1080–L 1082, Jul. 1, 1989.

M. Ozeki, K. Mochizuki, N. Ohtsuka, and K. Kodama Kinetic processes in atomic–layer epitaxy of GaAs and AlAs using a pulsed vapor–phase method, J. Vac. Sci. Technol. B 5(4), Jul./Aug. 1987.

* cited by examiner

METHOD FOR GROWING THIN FILMS BY CATALYTIC ENHANCEMENT

RELATED APPLICATIONS

This application claims benefit of provisional application No. 60/261,946, filed Jan. 16, 2001.

TECHNICAL FIELD

The present invention relates to a method of growing thin films on substrates in a reaction space being subjected to alternately repeated steps of feeding a precursor followed by feeding a catalyst for the precursor to grow the desired thin film.

BACKGROUND OF THE INVENTION

There are a variety of methods employed in the art of growing thin films. For example, chemical vapor deposition (CVD) has been used for many years to deposit solid thin films for a variety of commercial products including integrated circuits. The CVD method consists of exposing a substrate in a reaction chamber to one or more gaseous species that react to form a solid thin film on the substrate surface. CVD may be carried out at atmospheric or subatmospheric pressures, and usually requires that the reactivity of the gases be enhanced by heating the substrate or by creating a glow discharge in the reaction chamber. One of the disadvantages of the CVD method is that the gases may take part in undesired gas phase reactions. These undesired gas phase reactions may lead to the formation of particulates, and may also deplete the seed gases before they can reach all areas of the substrate. Thus, the undesired gas phase reactions can impact the quality and uniformity of the thin film being deposited.

An example of a specific CVD process is disclosed in U.S. Pat. No. 6,110,530 assigned to the assignee of the present application. The '530 patent discloses a CVD process for depositing a solid thin film of copper that employs a single gaseous precursor to form the copper layer. Although that precursor, hexafluoroacetylacetonate-Cu-trimethylvinylsilane (hereinafter hfac-Cu-TMVS), is sufficiently reactive to deposit copper at temperatures below 200° C., the copper deposition rate is undesirably slow. It is, however, undesirable to raise the processing temperature to increase the reaction rate because, among other reasons, higher processing temperatures may degrade previously deposited layers on the substrate. It was found that the slow deposition rate at lower temperatures could be increased by adding water to the hfac-Cu-TMVS precursor. It appears that the water may act as a catalyst, facilitating the decomposition of hfac-Cu-TMVS at lower temperatures. Although the addition of water avoids the need to carry out the CVD deposition at higher temperatures, the problem of undesired gas phase reactions remains. Specifically, the addition of water also facilitates the decomposition of hfac-Cu-TMVS in the gas phase, which can lead to problems such as particulate formation. In other words, catalytically converting the copper precursor to elemental copper with water during a single processing step within the reaction chamber, although having certain advantages, suffers from processing limitations to which the present invention is intended to address.

When a CVD reaction requires more than one gaseous reactant, undesired gas phase reactions between them can by avoided by separately and sequentially introducing the gaseous reactants into the reaction chamber. One method that employs the separate and sequential introduction of gaseous reactants is the Atomic Layer Deposition (ALD) method, one version of which is described in U.S. Pat. No. 4,058,430. In ALD, the substrate is heated to a temperature such that when a first gas is introduced into a reaction chamber, it chemisorbs on the substrate surface, forming a monolayer. An exact monolayer can be formed because the first layer of the gaseous species is relatively strongly bonded to the surface of the substrate by the chemisorption reaction while any excess reactant is relatively weakly bonded to the chemisorbed monolayer. The excess first gaseous reactant can then be removed from the reaction chamber. This removal may take place by, for example, evacuating the reaction chamber with a vacuum pump or by purging the reaction chamber with an inert gas. Ideally, the monolayer of the first gaseous species remains on the heated substrate surface after the removal of the excess reactant. Next, a second gaseous reactant is introduced into the reaction chamber. The second gaseous reactant reacts with the monolayer to produce the desired solid thin film. The excess of the second reactant, along with any reaction by-products, are then removed from the reaction chamber. Again, the removal may take place by means of evacuating the reaction chamber or purging the reaction chamber with an inert gas. A distinguishing characteristic of the ALD process is that it deposits a precise layer thickness each time the above sequence of steps is repeated. A precise layer thickness is obtained because of the formation of an exact monolayer of the first precursor. The above sequence of steps can be repeated until a thin film of desired thickness is created.

Although ALD may eliminate undesired gas phase reactions between multiple CVD precursors, ALD has a number of disadvantages that limit its utility. One of those disadvantages is that the ALD process can only be used with gaseous species that react with the substrate and with each other within a "temperature window". The temperature window is defined by the constraints that the substrate temperature must be high enough for the second gaseous reactant to react with the chemisorbed monolayer of the first gaseous reactant, but the substrate temperature cannot be so high that the monolayer of the first reactant desorbs. This temperature window severely limits the number of species that are compatible with the ALD process. Furthermore, the temperature window limitation of ALD means that ALD cannot be used to deposit a film from a single gaseous species. The use of a single species is incompatible with ALD because the substrate temperature would have to be high enough for the species to react to form a solid film. Since the film formation reaction would consume any of the species introduced into the reactor, the precise thickness control characteristic of ALD would not be possible. In other words, the deposition process would degrade into CVD with a single reactant. Thus the precise layer control obtainable in ALD, which is made possible by separating the introduction of the gaseous reactants, cannot be achieved in a single species system.

SUMMARY OF THE INVENTION

The present invention is directed to a method of growing a thin film onto a substrate. The method comprises feeding a single gaseous precursor into a reaction space. The precursor is caused to adsorb onto the surface of the substrate to form a layer. A catalyst is then fed into the reaction space in an amount to substantially convert the layer of the precursor into the desired thin film. Embodiments of the present invention overcome the shortcomings of previously available CVD and ALD methods.

DETAILED DESCRIPTION OF THE INVENTION

It is now proposed to employ a catalyst in a process that employs a single gaseous precursor in such a manner that the precise layer thickness control of the ALD process can be obtained. Specifically, the process comprises the steps of introducing a single gaseous precursor into a reaction chamber under conditions such that a portion of the precursor adsorbs on the substrate and subsequently converting the adsorbed precursor to the desired thin film through the use of a suitable catalyst.

As illustrative of the present invention, reference is made once again to the creation of a thin film of copper metal on a substrate through the use of the precursor hfac-Cu-TMVS.

The copper film is produced pursuant to the following reaction:

$$2(\text{hfac})\text{-Cu-(TMVS)} \rightarrow \text{Cu}° + \text{Cu(hfac)}_2 + 2\text{TMVS}$$

It is known that water will catalytically promote this reaction. As such, the present invention contemplates introducing the precursor hfac-Cu-TMVS, into a reaction chamber, generally maintained at low pressure, causing the precursor to adsorb onto the substrate, which may be heated and which is located within the reaction chamber. Like in an ALD process, the adsorption may take place by means of chemisorbing an exact monolayer of the precursor onto the substrate. Formation of a monolayer in this manner will produce the type of precise layer control characteristic of an ALD process. On the other hand, it is also possible to carry out the claimed method under conditions in which the precursor physisorbs onto the substrate. When the precursor physisorbs onto the substrate, layer thickness control may be achieved, for example, by controlling the amount of precursor introduced into the reaction chamber. It is to be appreciated that the substrate temperature may be modified to facilitate the appropriate type of adsorption, which may differ for different applications of the claimed process.

After the precursor adsorbs onto the substrate in the appropriate manner, a catalyst is introduced into the chamber. The catalyst is chosen so that the adsorbed precursor reacts to form the desired thin film at the substrate temperature. The use of a catalyst allows the film formation reaction to occur at lower temperatures, so that the problem of high temperature desorption of the precursor can be ameliorated. Where the precursor is hfac-Cu-TMVS, a suitable catalyst is water. The introduction of water lowers the temperature required for hfac-Cu-TMVS to decompose into elemental copper. Specifically, the addition of water allows the substrate temperature to be less than about 150° C., and possibly as low as 100° C. The addition of a catalyst with a single precursor allows the deposition process to be carried out at temperatures low enough to prevent desorption of the precursor, yet high enough, due to the addition of the catalyst, to permit the film-formation reaction. Thus it is possible to extend some of the advantages of ALD to a single precursor system, while overcoming the disadvantages of prior art techniques.

The precursor and the catalyst may be introduced into the reaction chamber by any appropriate method. For example, the precursor could be introduced in the form of a gaseous stream of pure precursor, or the precursor entrained within a flow of a carrier gas. Similarly, the catalyst could be introduced alone or mixed with a carrier gas. The choice of carrier gas would be dictated by the precursor and catalyst chemistries. For the example system of hfac-Cu-TMVS and water, examples of suitable carrier gases are $H_2$, Ar and $N_2$.

After the precursor is adsorbed onto the substrate surface, but before the introduction of the catalyst into the reactor, if any excess non-adsorbed precursor exists, it may be removed from the proximity of the substrate. This removal of the precursor may be desirable in order to control the amount of precursor adsorbing on the substrate, or to prevent the precursor from reacting in the gas phase when catalyst is introduced into the reactor. In an alternative embodiment of the claimed method, however, precursor may continue to be introduced into the reaction chamber while the catalyst is introduced. This embodiment may be useful when the stoichiometry of the deposition reaction requires more than one precursor molecule. For example, in the deposition of copper from hfac-Cu-TMVS, two molecules of the precursor are needed to apply a single molecule of copper. As such, introducing additional precursor with the water catalyst encourages production of the final film.

When it is desired to remove excess or non-adsorbed precursor from the proximity of the substrate before introduction of the catalyst, any suitable method may be used to accomplish the removal. For example, the precursor could be removed by evacuating the reaction chamber with a vacuum pump. Alternatively, removal could occur by purging the reaction chamber with a gas. The purge could consist of flowing the gas between the introduction into the reaction chamber of flows of pure precursor and catalyst, or the purge could consist of flowing just the carrier gas while ceasing to introduce precursor or catalyst into the flow of carrier gas. The gas could be an inert gas such as Ar and $N_2$, or a gas that is not necessarily inert such as $H_2$. It is to be appreciated that when the precursor is removed by purging the reaction chamber, the extent of the purge may be varied. In other words, in some embodiments it may be desirable to purge the reaction chamber with a sufficient volume of purge gas so that the excess precursor, if any, is essentially completely removed from the reaction chamber. The volume of purge gas could be adjusted by varying the purge gas volumetric flow rate, the amount of time the purge gas flows through the reactor, or by varying the reactor pressure. In alternative embodiments, a smaller volume of purge gas could be used to remove the precursor from each localized area of the substrate before the catalyst arrives at that localized area. Using a smaller volume of purge gas in this manner could reduce the cycle time required for the process.

After the desired film-formation reactions have occurred, it may be desirable to remove the catalyst and any reaction products from the proximity of the substrate. The same removal techniques described above are also suitable for removing the catalyst and reaction products from the reaction chamber. The above sequence of steps, namely, the introduction of the precursor, the optional removal of excess precursor, introduction of catalyst, and the optional removal of catalyst and reaction products, may be repeated to achieve the desired film thickness.

An apparatus useful in carrying out the proposed method could be the same apparatuses generally employed in the formation of thin films by CVD or by ALD. For example, the exemplary process for copper deposition can be carried out on an xZ-series CVD reactor, which is marketed by Applied Materials, Inc. of Santa Clara, Calif.

It should be noted that although the present invention has been described with respect to the precursor, hfac-Cu-TMVS, employed together with water as the catalyst, this example is intended to be merely illustrative of the present invention directed to method of cyclically introducing a precursor and a catalyst into a reaction chamber in order to create a suitable film.

Although the present invention has been illustrated using a specific embodiment, the invention is not meant to be so limited. It is intended that the present invention be defined solely by the appended claims.

What is claimed is:

1. A method for depositing a metal-containing film to a substrate within a process chamber by an atomic layer deposition technique, comprising:
   introducing a precursor to the process chamber;
   adsorbing the precursor to the substrate;
   purging the process chamber with a purge gas;
   introducing a process gas comprising the precursor and a reactant;
   reacting the adsorbed precursor with the process gas to deposit the metal-containing film; and
   purging the process chamber with the purge gas.

2. The method of claim 1, wherein the metal-containing film comprises copper.

3. The method of claim 2, wherein the precursor comprises a copper precursor.

4. The method of claim 3, wherein the copper precursor is copperhexafluoracetylacetonate trimethylvinylsilane.

5. The method of claim 3, wherein the reactant comprises water.

6. The method of claim 5, wherein the purge gas is selected from the group consisting of argon, nitrogen, hydrogen and combinations thereof.

7. A method for depositing a metal-containing film to a substrate within a process chamber by an atomic layer deposition technique, comprising:
   introducing a metal-containing precursor to the process chamber;
   adsorbing the metal-containing precursor to the substrate;
   purging the process chamber with a purge gas;
   introducing a process gas comprising the metal-containing precursor and a gaseous catalyst;
   chemically reducing the adsorbed metal-containing precursor with the process gas to deposit the metal-containing film; and
   purging the process chamber with the purge gas.

8. The method of claim 7, wherein the metal-containing film comprises copper.

9. The method of claim 8, wherein the metal-containing precursor comprises a copper precursor.

10. The method of claim 9, wherein the copper precursor is copperhexafluoracetylacetonate trimethylvinylsilane.

11. The method of claim 9, wherein the gaseous catalyst comprises water.

12. The method of claim 11, wherein the purge gas is selected from the group consisting of argon, nitrogen, hydrogen and combinations thereof.

13. A method for depositing a copper-containing film to a substrate within a process chamber by an atomic layer deposition technique, comprising:
   introducing a copper precursor to the process chamber;
   adsorbing the copper precursor to the substrate;
   purging the process chamber with a purge gas;
   introducing a process gas comprising the copper precursor and a reactant;
   reacting the adsorbed copper precursor with the process gas; and
   purging the process chamber with the purge gas.

14. The method of claim 13, wherein the copper precursor is copperhexafluoracetylacetonate trimethylvinylsilane.

15. The method of claim 14, wherein the reactant comprises water.

16. The method of claim 13, wherein the reactant comprises water.

17. The method of claim 16, wherein the purge gas is selected from the group consisting of argon, nitrogen, hydrogen and combinations thereof.

18. A method of growing a thin film onto a substrate located with a reaction chamber comprising feeding a precursor of the film into the reaction chamber, causing the precursor to adsorb onto the surface of the substrate to form a layer thereof, and feeding a catalyst and the precursor into the reaction chamber in amounts to substantially convert the layer of the precursor to the thin film, wherein the precursor comprises copperhexafluoracetylacetonate trimethylvinylsilane.

19. The method of claim 18, wherein the catalyst comprises water and the film comprises copper.

* * * * *